United States Patent — Kim
US 6,376,307 B1
Apr. 23, 2002

(54) METHOD FOR FABRICATING NOR TYPE MEMORY CELLS OF NONVOLATILE MEMORY DEVICE

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 09/684,669

(22) Filed: Oct. 6, 2000

(30) Foreign Application Priority Data

Oct. 7, 1999 (KR) ............................................. 99-43293

(51) Int. Cl.[7] ............................................. H01L 21/336
(52) U.S. Cl. ...................................... 438/257; 227/382
(58) Field of Search ............................... 438/257, 258, 438/587, 591, 595, 618, 620, 621, 622, 675; 257/382, 408

(56) References Cited

U.S. PATENT DOCUMENTS

| | | |
|---|---|---|
| 5,278,785 A | 1/1994 | Hazani |
| 5,345,417 A * | 9/1994 | Crotti ........................ 365/185 |
| 5,597,748 A | 1/1997 | Asano et al. |
| 5,814,862 A * | 9/1998 | Sung et al. ................. 257/344 |
| 5,870,334 A | 2/1999 | Hemink et al. |
| 5,949,714 A | 9/1999 | Hemink et al. |
| 5,963,480 A | 10/1999 | Harari |
| 6,060,360 A | 5/2000 | Lin et al. |
| 6,114,767 A * | 9/2000 | Nagai et al. ................. 257/758 |
| 6,197,639 B1 * | 3/2001 | Lee et al. .................... 438/258 |

* cited by examiner

*Primary Examiner*—David Nelms
*Assistant Examiner*—Quoz Hoang
(74) *Attorney, Agent, or Firm*—Timothy J. Keefer; Wildman, Harrold, Allen & Dixon

(57) ABSTRACT

A method for fabricating NOR type memory cells of a nonvolatile memory device, floating gate insulating film, a floating gate electrode, a control gate insulating film, a control gate electrode, and an insulating film sequentially stacked in the shape of pattern on each of memory cell regions of a semiconductor substrate defined by an isolation film are formed; a source electrode and a drain electrode are formed in portions of the semiconductor substrate exposed at both sides of the gate electrode, a first etching barrier film is formed on the resultant; a first interlayer insulating film is formed on the first etching barrier film in a planarized fashion; a desired portion of the first interlayer insulating film is etched to form a first contact hole exposing the source and drain electrodes; a first conductive film in a planarized fashion is formed on the resultant to bury the first contact hole; the first conductive film is etched to form a source electrode line contacting the source electrode and a contact plug contacting the drain electrode; a second etching barrier film is formed on the resultant; a second interlayer insulating film is formed in a planarized fashion on the second etching barrier film; a desired portion of the second insulating film is etched to form second contact hole exposing the contact plug; and a bit line connected to the contact plug is formed via the second contact hole on the second interlayer insulating film.

6 Claims, 17 Drawing Sheets

METHOD FOR FABRICATING NOR TYPE MEMORY CELLS OF NONVOLATILE MEMORY DEVICE

CROSS REFERENCE TO RELATED APPLICATION

This application claims the priority of Korean patent application Serial No. 99-43293 filed on Oct. 7, 1999.

BACKGROUND OF THE INVENTION

1. Field of the Invention

The present invention relates to a method for fabricating a semiconductor device, and more particularly to a method for fabricating NOR type memory cells of a nonvolatile memory device such as an EEPROM or a flash memory device.

2. Description of the Related Art

Recently, nonvolatile memory devices such as EEPROMs or flash memories have been used in all domestic electronic appliances, easily available in the surroundings, such as digital cellular phones, digital set-top boxes, digital cameras, personal computers, modems, facsimiles, digital camcorders, and DVD players. In order to achieve a miniature and high performance of such domestic electronic appliances, active research is being made for a high integration of EEPROMs or flash memories.

As well known, the memory cell structure of such an EEPROM or flash memory is of a NOR type or of a NAND type.

Referring to FIG. 1a, a NOR type memory cell structure is illustrated. In the NOR type memory cell structure of FIG. 1a, each memory cell is connected at a drain electrode D thereof to a bit lines BL, at a gate electrode G thereof, that is, a control gate cg thereof, to a word line WL, and at a source electrode S thereof to a source electrode line SL. In FIG. 1a, the reference character "fg" denotes a floating gate electrode of each memory cell.

Such a NOR type memory cell structure has an advantage in that it has a high operating speed. However, this NOR type memory cell structure has a drawback in that it is difficult to achieve an improvement in integration because each memory cell has a contact. In other words, each memory cell of the NOR type memory cell structure is connected at its drain electrode D to an associated bit line BL, and at its source electrode S to an associated source electrode line SL. For this reason, the memory cell must have a certain contact area for providing contacts for connecting to the bit and source electrode lines. As a result, it is difficult to achieve an improvement in integration.

Referring to FIG. 1b, a NAND type memory cell structure is illustrated. In the NAND type memory cell structure of FIG. 1b, 8 memory cells are connected to a first bit line BL1 to which a pair of select transistors TR1 and TR2 are also coupled. Another 8 memory cells are connected to a second bit line BL2 to which a pair of select transistors TR3 and TR4 are also coupled. Opposite to the first and second bit lines BL1 and BL2, a source electrode line SL is connected to respective source electrodes S of the select transistors TR2 and TR4. By this arrangement, the 16 memory cells form a unit memory. Such a NAND memory cell structure has an advantage in that it can easily achieve an improvement in integration because it is unnecessary to provide contacts at all memory cells. In other words, in this NAND memory cell structure, each bit line BL1 or BL2 is connected only to the drain electrode D of a first one of the associated 8 memory cells. The connections of the remaining 7 memory cells to the associated bit line are achieved in that those memory cells are connected in series to the first memory cell. The source electrode line SL is connected to the source electrode S of the last one of the 8 memory cells. By virtue of such an arrangement, the area required for the connection of the memory cells to the bit and source electrode lines is minimized. Accordingly, it is easy to achieve an improvement in integration.

However, this NAND type memory cell structure additionally requires 4 select transistors for every 16 memory cells. For this reason, there is a drawback of a low operating speed.

Accordingly, current domestic electronic appliances mainly use products of the NOR type memory cell structure because the NOR type memory cell structure has a high operating speed, as compared to the NAND type memory cell structure, even though it has a drawback in that it is difficult to achieve a high integration, as compared to the NAND type memory cell structure.

FIG. 2 is a plan view illustrating masks mainly used in the manufacture of NOR type memory cells in accordance with a conventional method. In FIG. 2, the reference numeral "202" denotes an isolation mask, "206" a control gate electrode mask, and "208" a contact mask. The reference character "A" denotes a unit memory cell.

A source electrode line is formed by a diffusion region formed in a semiconductor substrate. Respective source electrodes of unit memory cells aligned with one another are interconnected together by the source electrode line. The isolation mask 202 is designed in such a fashion that it overlaps with the control gate electrode mask 206 at desired portions thereof. In FIG. 2, the reference character "b" denotes the overlap width (size) between the isolation mask 202 and the control gate electrode mask 206.

In such a conventional NOR type memory cell design, however, it is necessary to provide an increased cell area because there is an overlapping area between the isolation mask 202 and the control gate electrode mask 206. Due to such an increased cell area, it is difficult to achieve an improvement in integration.

SUMMARY OF THE INVENTION

Therefore, an object of the invention is to provide a method for fabricating NOR type memory cells of a nonvolatile memory device, which is capable of achieving an improvement in integration.

In accordance with the present invention, this object is accomplished by providing method for fabricating NOR type memory cells of a nonvolatile memory device, comprising the steps of: forming a floating gate insulating film, a floating gate electrode, a control gate insulating film, a control gate electrode, and an insulating film sequentially stacking in the shape of pattern on each of memory cell regions of a semiconductor substrate defined by an isolation film; forming a source electrode and a drain electrode in portions of the semiconductor substrate exposed at both sides of the gate electrode, respectively; forming a first etching barrier film on the resultant; forming a first interlayer insulating film on the first etching barrier film in a planarized fashion; etching a desired portion of the first interlayer insulating film so as to form first contact hole exposing the source and drain electrodes, respectively; forming a first conductive film in a planarized fashion on the resultant so as to bury the first contact hole; etching the first conductive film so as to form a source electrode line contacting the source electrode and a contact plug contacting the drain electrode; forming a second etching barrier film on the resultant; forming a second interlayer insulating film in a planarized fashion on the second etching barrier film; etching a desired portion of the second insulating film so as to form second contact hole exposing the contact plug; and forming a bit line connected to the contact plug via the second contact hole on the second interlayer insulating film.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF THE PREFERRED EMBODIMENTS

The technical subject matter of the present invention is to achieve a reduction in unit cell size in the manufacture of NOR type memory cells of a nonvolatile memory device. In order to achieve a reduction in unit cell size, a metal line is provided, which serves as a source electrode line, in accordance with the present invention. Respective source electrodes of unit memory cells are coupled to the metal line. In accordance with the present invention, impurity diffusion regions for source electrodes are isolated between neighboring cells. As a result, it is unnecessary to provide an overlap between an isolation mask and a control gate electrode mask. This results in an improvement in the integration degree of NOR type memory cells.

Figure 1A:
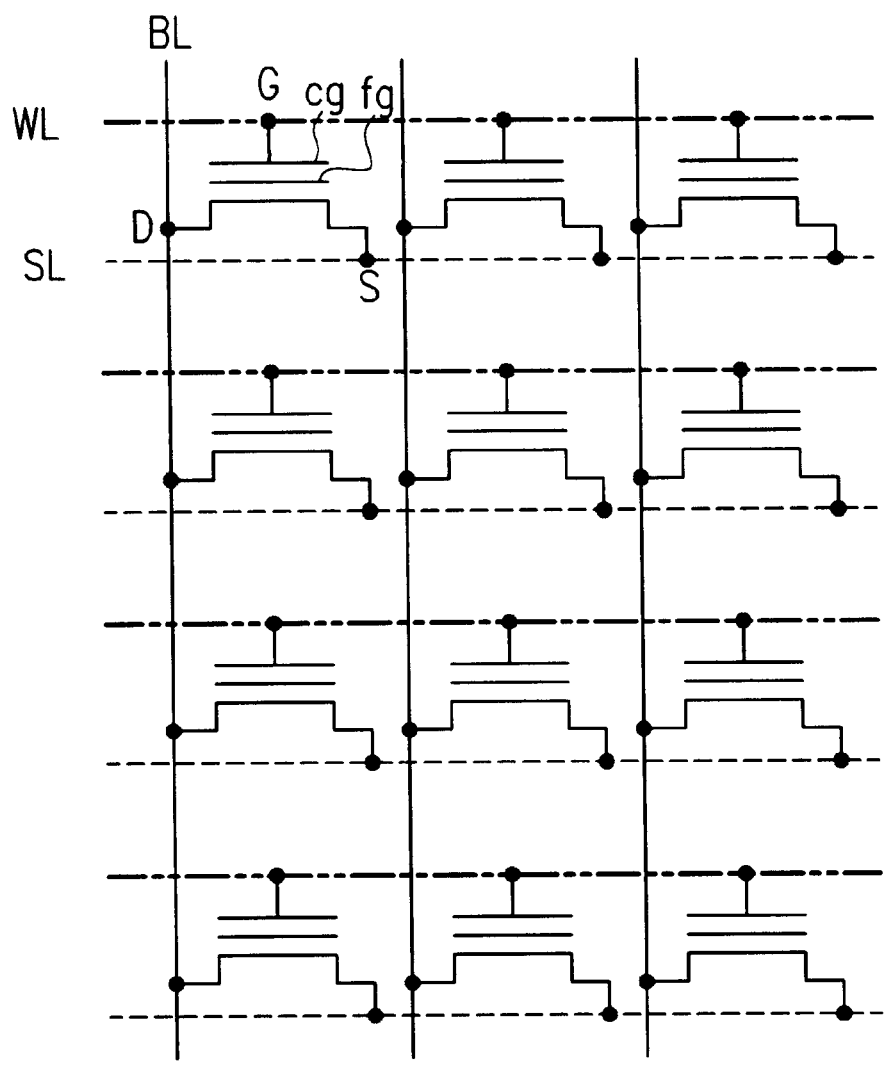
FIG. 1a is a circuit diagram illustrating a NOR type memory cell structure of a conventional EEPROM memory device.
Figure 1B:
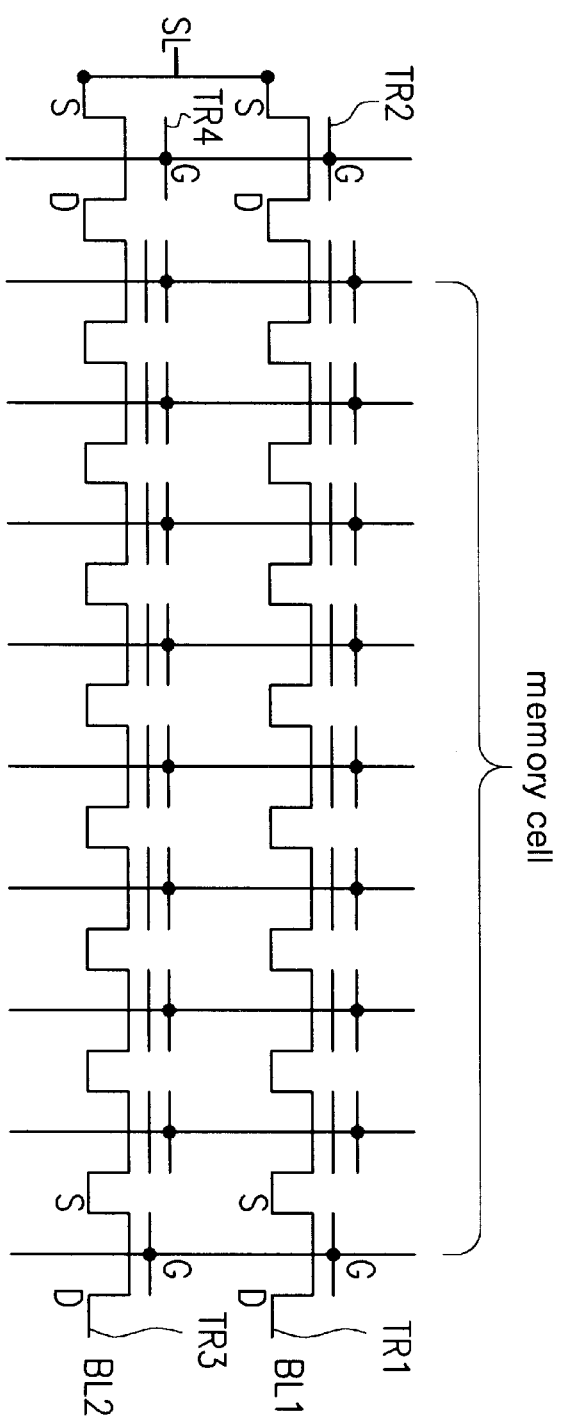
FIG. 1b is a circuit diagram illustrating a NAND type memory cell structure of a conventional EEPROM memory device.
Figure 2:
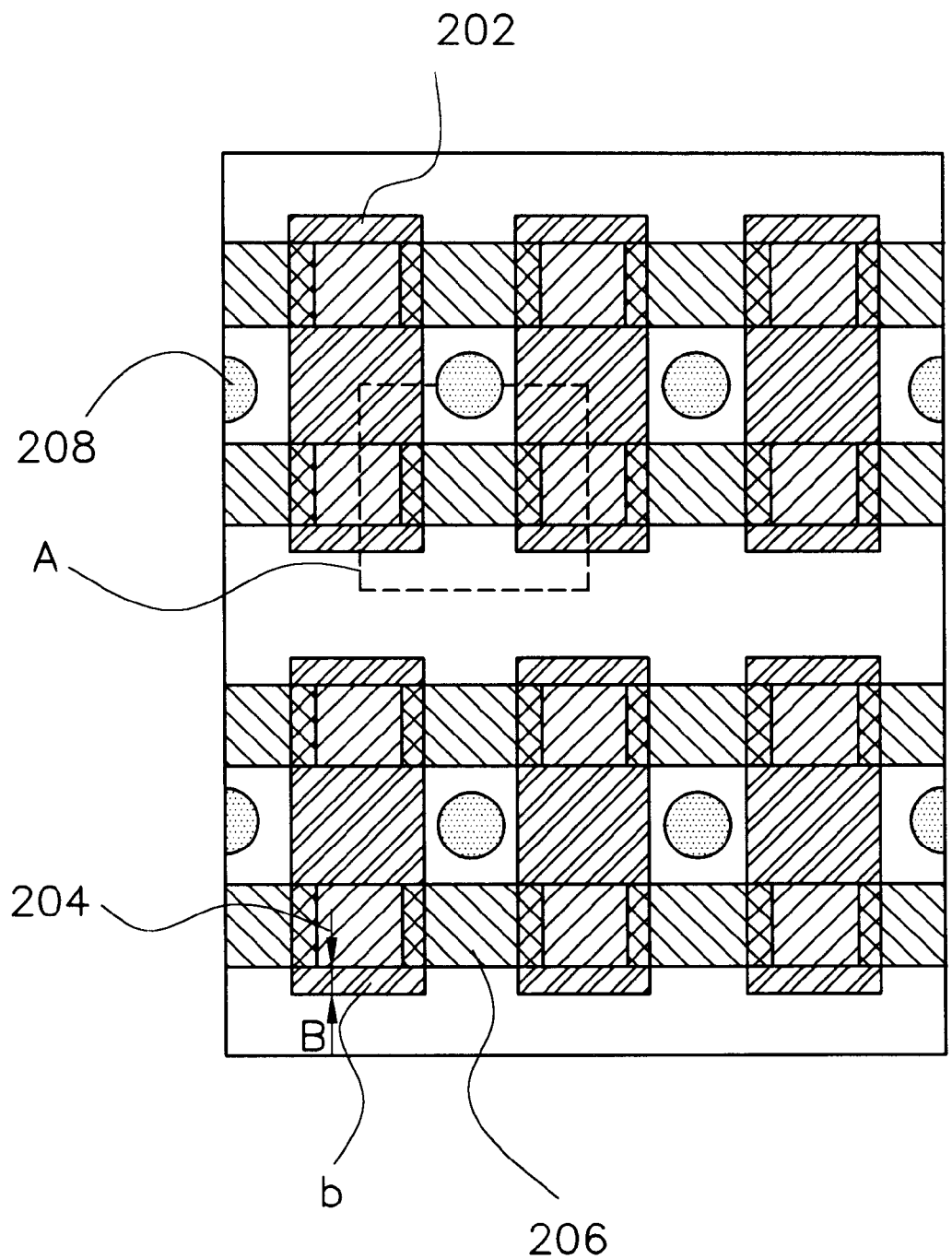
FIG. 2 is a plan view illustrating masks mainly used in the manufacture of NOR type memory cells in accordance with a conventional method.
Figure 3:
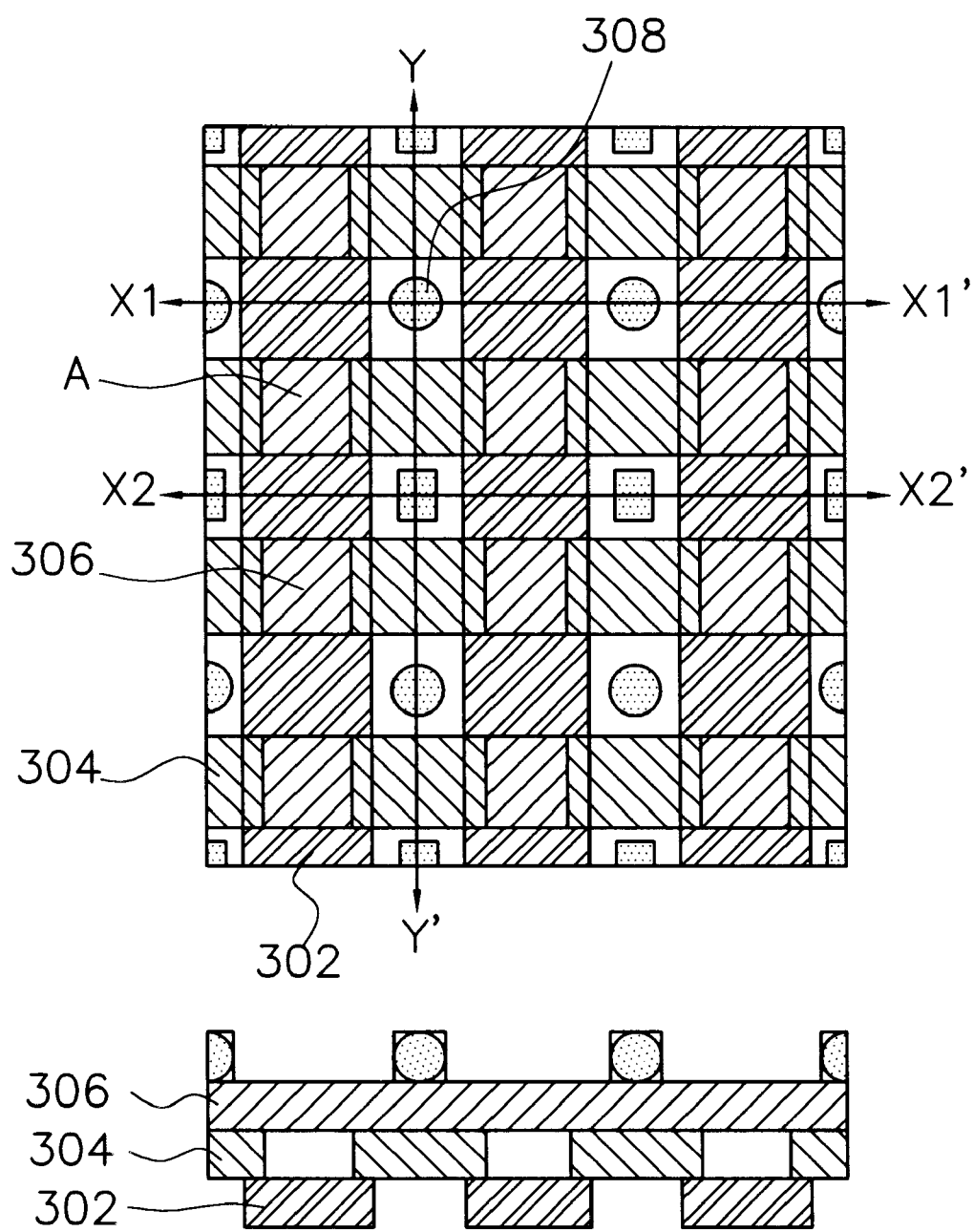
FIG. 3 illustrates plan and cross-sectional views of essential masks according to an embodiment of the present invention.

FIG. 3 illustrates plan and cross-sectional views of essential masks according to an embodiment of the present invention. In FIG. 3, the reference numeral "302" denotes an isolation mask, "304" a floating gate electrode mask, "306" a control gate electrode mask, and "308" a contact mask. As shown in FIG. 3, these masks are sequentially laminated over one another to form a laminated mask structure. In FIG. 3, the reference character "A" denotes a unit memory cell.

Figure 4A:
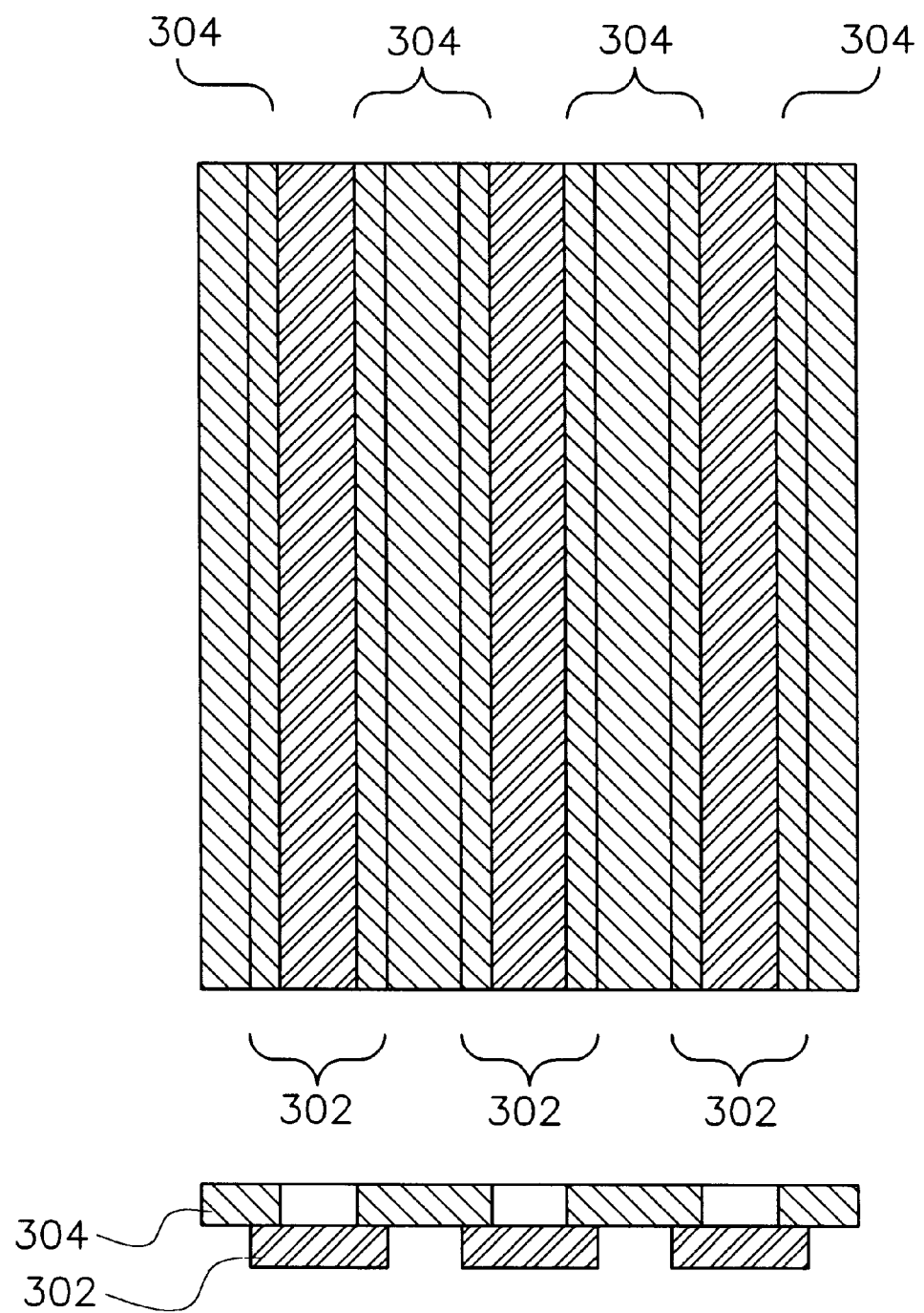
FIG. 4a illustrates plan and cross-sectional views of an isolation mask and a gate electrode mask shown in FIG. 3.

FIG. 4a illustrates plan and cross-sectional views of the isolation mask and gate electrode mask according to the present invention. As shown in FIG. 4a, the isolation mask 302 has a structure including a plurality of mask portions respectively formed at shield regions thereof in such a fashion that they extend longitudinally while being laterally spaced from one another to define an opening between neighboring ones thereof. Preferably, the openings extend longitudinally while being uniformly spaced from one another in a lateral direction. The floating gate electrode mask 304 has a structure including a plurality of mask portions respectively formed at shield regions thereof corresponding to respective openings of the isolation mask 302 in such a fashion that they extend longitudinally while being laterally spaced from one another to define an opening between neighboring ones thereof. Preferably, each mask portion of the floating gate electrode mask 304 overlaps with an associated mask portion of the isolation mask 302 at an edge thereof.

Figure 4B:
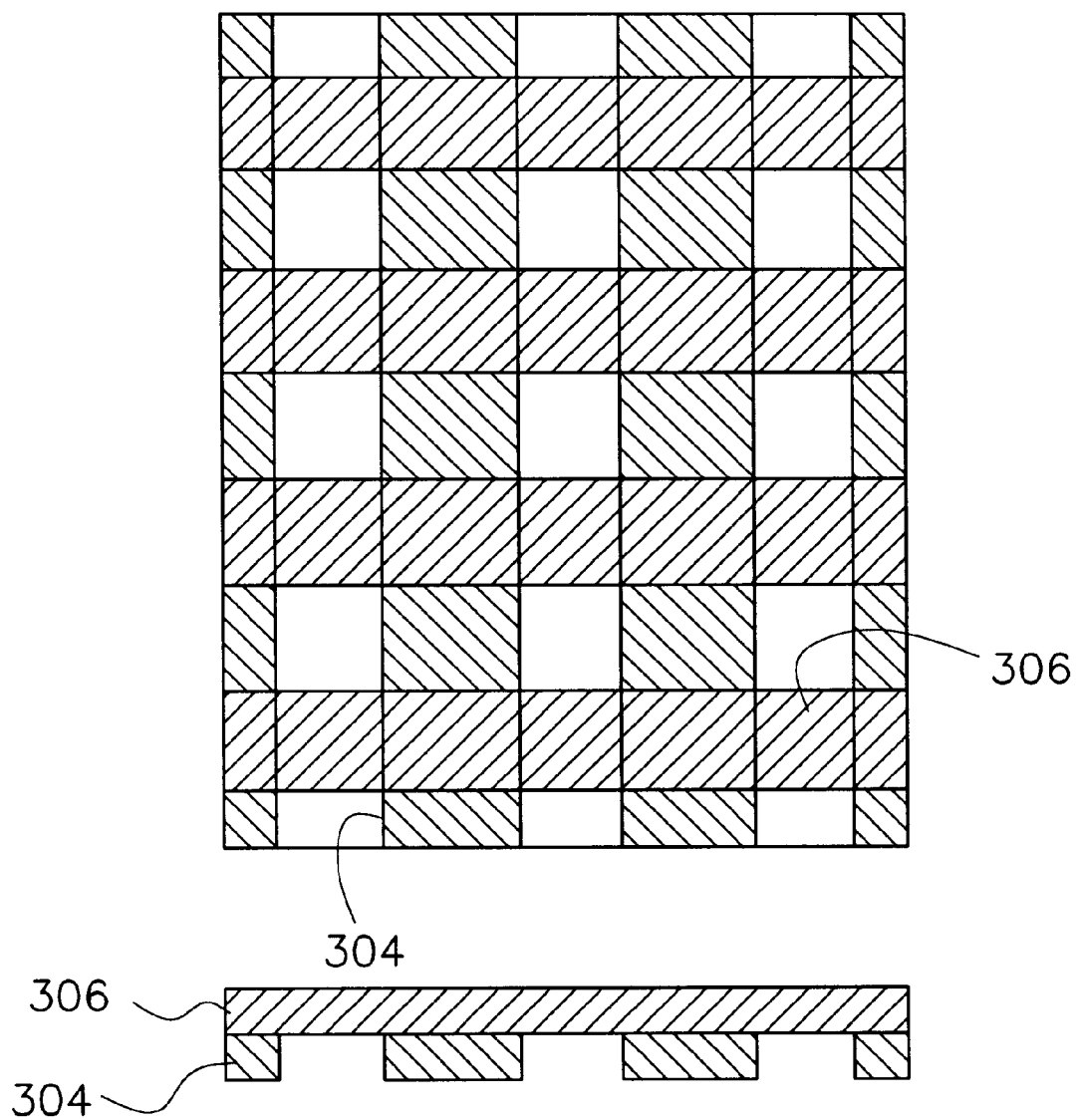
FIG. 4b illustrates plan and cross-sectional views of a floating gate electrode mask and a control gate electrode mask shown in FIG. 3.

FIG. 4b illustrates plan and cross-sectional views of the floating gate electrode mask and control gate electrode mask according to the present invention. As shown in FIG. 4b, the floating gate electrode mask 304 has a structure including a plurality of mask portions respectively formed at shield regions in such a fashion that they extend longitudinally while being laterally spaced from one another to define an opening between neighboring ones thereof. Preferably, the openings extend longitudinally while being uniformly spaced from one another in a lateral direction. The control gate electrode mask 306 has a structure including a plurality of mask portions respectively formed at shield regions thereof in such a fashion that they extend laterally while being longitudinally spaced from one another to define a laterally extending opening between neighboring ones thereof. The mask portions and openings of the control gate electrode mask 306 are orthogonal to those of the floating gate electrode mask 304.

Figure 4C:
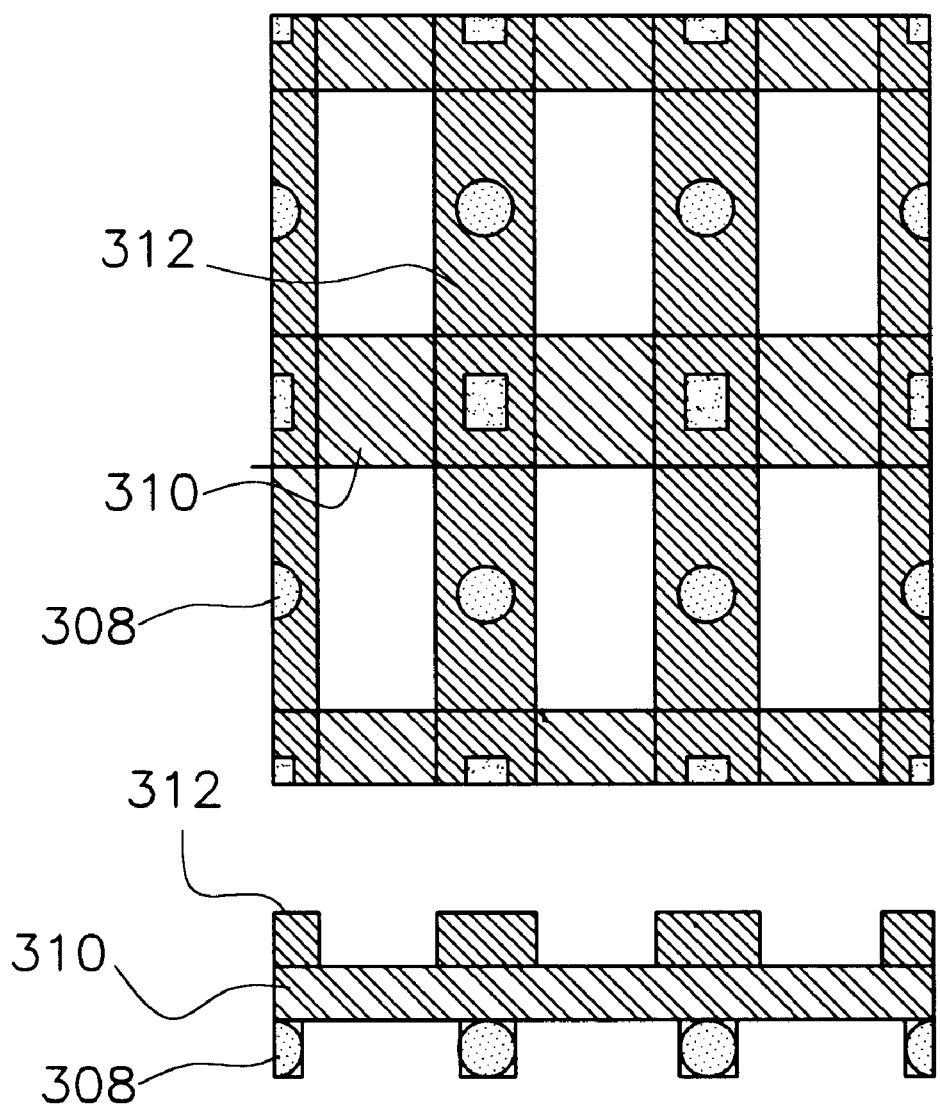
FIG. 4c illustrates plan and cross-sectional views of a contact mask, a source electrode line mask, and a bit line mask shown in FIG. 3.

FIG. 4c illustrates plan and cross-sectional views of the contact mask, source electrode line mask, and bit line mask according to the present invention. As shown in FIG. 4c, the source electrode line mask 310 is arranged on the upper surface of the contact mask 308. The source electrode line mask 310 has a structure including a plurality of mask portions respectively formed at shield regions in such a fashion that they extend laterally while being longitudinally spaced from one another to define an opening between neighboring ones thereof. Preferably, the openings extend laterally while being uniformly spaced from one another in a longitudinal direction. The bit line mask 312 is arranged on the source electrode line mask 310 and has a structure including a plurality of mask portions respectively formed at shield regions thereof in such a fashion that they extend longitudinally while being laterally spaced from one another to define a longitudinally extending opening between neighboring ones thereof.

Figure 5:
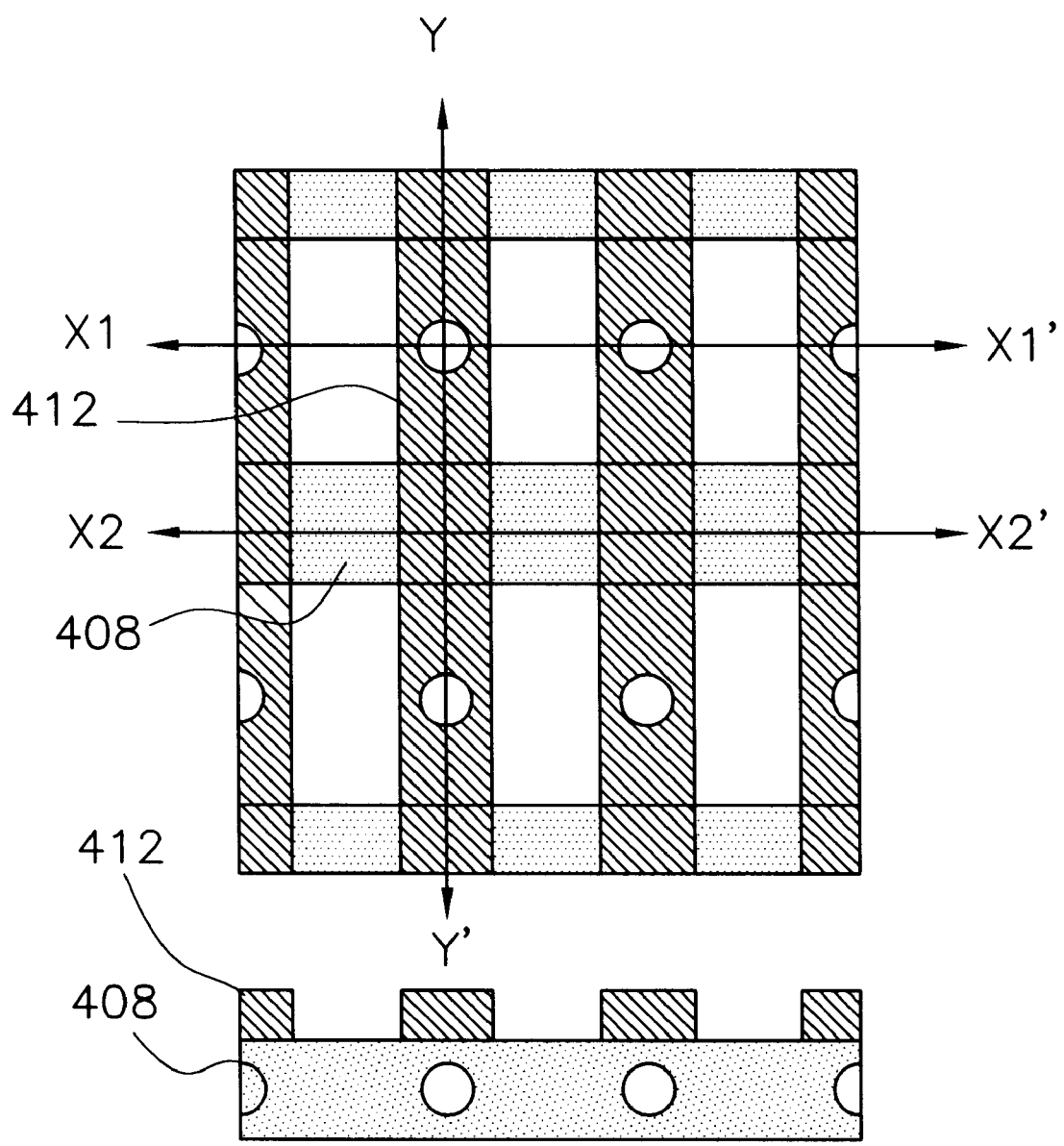
FIG. 5 illustrates plan and cross-sectional views of essential masks according to another embodiment of the present invention.

FIG. 5 illustrates plan and cross-sectional views of essential masks according to another embodiment of the present invention. As shown in FIG. 5, contacts, which are adapted to connect the source electrode of each memory cell to a source electrode line, are formed to have a shape other than a hole shape, for example, a trough shape, in accordance with this embodiment. By virtue of such a contact structure, the use of a source electrode line mask is eliminated.

Now, a method for fabricating NOR memory cells using the masks of FIG. 3 or 5 in accordance with an embodiment of the present invention will be described with reference to FIGS. 6a to 6e. In FIGS. 6a to 6e, the left view of each figure is a cross-sectional view taken along the line X1–X1' of FIG. 3, the middle view of each figure is a cross-sectional view taken along the line Y–Y' of FIG. 3, and the right view of each figure is a cross-sectional view taken along the line X2–X2' of FIG. 3.

Figure 6A:
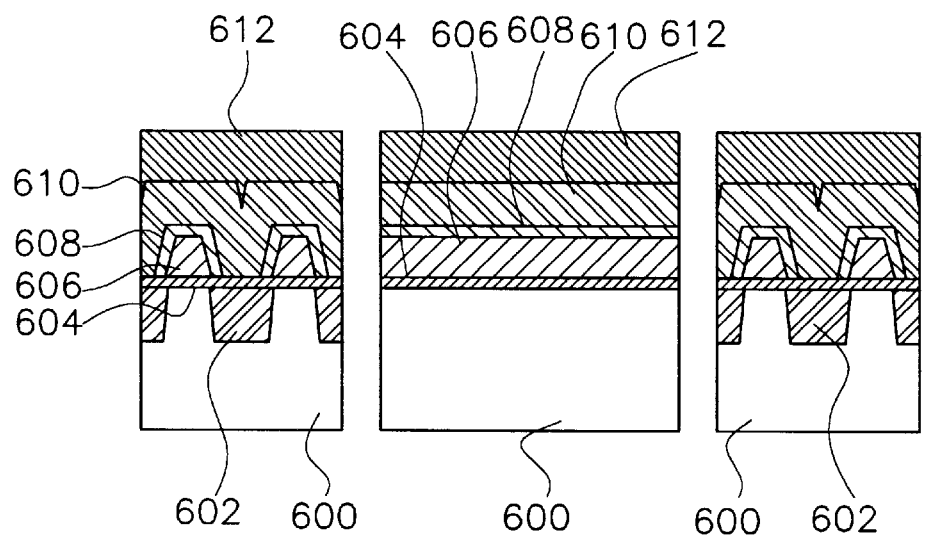
FIGS. 6a to 6e are cross-sectional views respectively illustrating a method for fabricating NOR memory cells in accordance with an embodiment of the present invention, in which each figure includes cross-sectional views respectively taken along the lines X1–X1', Y–Y', and X2–X2' of FIG. 3.

Referring to FIG. 6a, an isolation film 602 is first formed at desired regions of a semiconductor substrate 600 in accordance with a well-known thermal oxidation process. A floating gate insulating film 604, which is made of an oxide film or an oxide nitride film, is then formed over the semiconductor substrate 600 and isolation film 602. Subsequently, a conductive film 606, which is to be used for the formation of floating gate electrodes, is formed over the entire upper surface of the resulting structure. The floating gate electrode conductive film 606 is then etched using the floating gate electrode mask 304 of FIG. 3 in such a fashion that the floating gate insulating film 604 is partially exposed. The etched floating gate electrode conductive film 606 has a pattern structure in which it has certain patterns at left and right cross-sectional portions thereof while having no pattern at the middle cross-sectional portion thereof. Over the resulting structure, a control gate insulating film 608, a conductive film 610, adapted to form control gate electrodes, and a planarized insulating film 612 are then formed in this order. Preferably, the control gate insulating film 608 is made of a nitride oxide film formed using a deposition of a nitride film, and an oxidation of the nitride film. The insulating film 612 is preferably made of a nitride film or an oxide film.

Figure 6B:
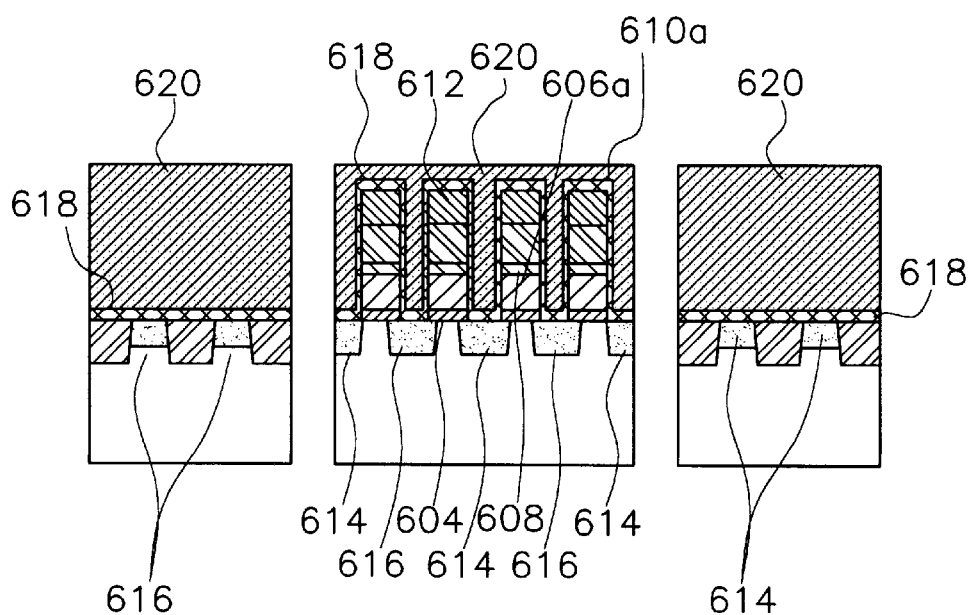

Referring to FIG. 6b, the insulating film 612, control gate electrode conductive film 610, control gate insulating film 608, floating gate electrode conductive film 606, and floating gate insulating film 604 are then etched using the control gate electrode mask 306 of FIG. 3. By this etching process, floating gate electrodes and control gate electrodes are formed by respective remaining portions of the conductive films 606 and 610 in such a fashion that each remaining portion of the control gate insulating film 608 is interposed between associated floating gate electrode and control gate electrode. Thereafter, source and drain electrodes 614 and 616 are formed. The formation of the source and drain electrodes 614 and 616 are achieved by implementing impurity ions, such as boron ions, arsenic ions, or phosphorous ions, into exposed portions of the semiconductor substrate 600, and then thermally diffusing the implemented impurity ions. A first etching barrier film 618 is then formed over the entire upper surface of the resulting structure. Subsequently, a first interlayer insulating film 620 is formed over the first etching barrier film 618 in such a fashion that it provides a planarized upper surface. The first etching barrier film 618 is preferably made of a nitride film. Preferably, the first interlayer insulating film 620 is made of an oxide film.

Figure 6C:
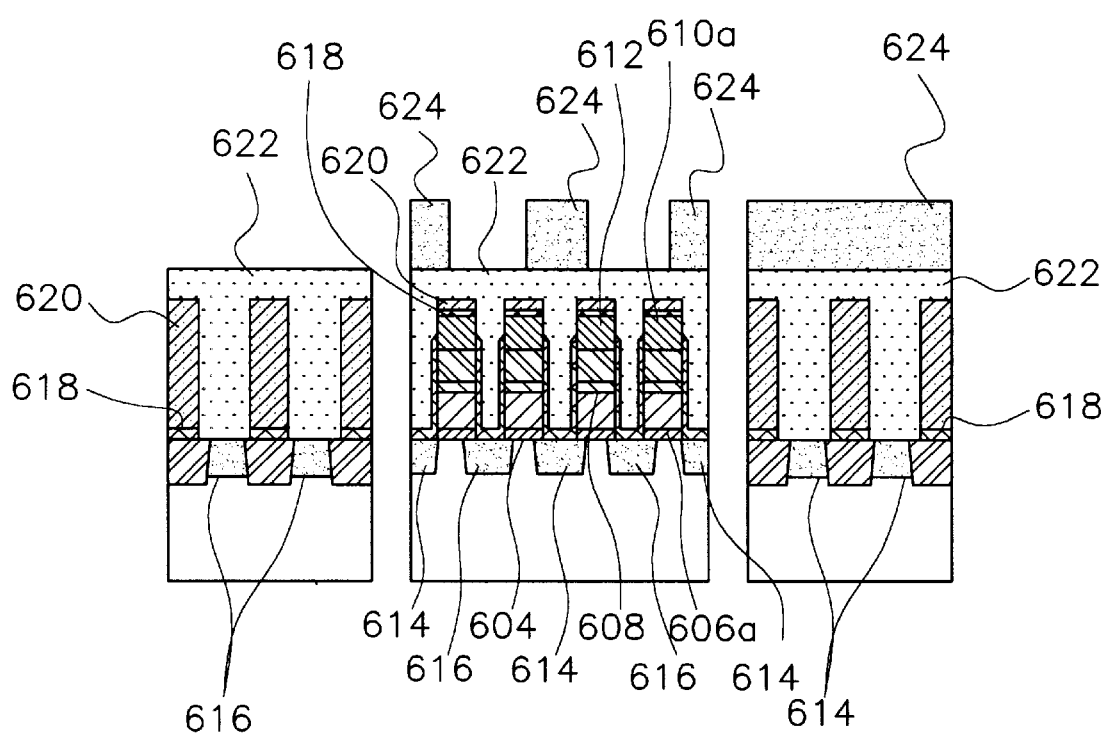

Referring to FIG. 6c, the first interlayer insulating film 620 is then partially etched using the first etching barrier film 618 and the contact mask 308 of FIG. 3 in such a fashion that its portions existing on the source and drain electrodes 614 and 616 are removed. Thereafter, the portions of the first etching barrier film 618 exposed due to the partial removal of the first interlayer insulating film 620 are then removed. As a result, first contact holes are defined, through which the source and drain electrodes 614 and 616 are exposed. The etching process for forming the first contact holes is carried out in accordance with a self-aligned contact process using the contact mask 308 and the first etching barrier film 618. Accordingly, the space between neighboring gate electrodes is minimized. That is, it is possible to achieve a high integration of NOR memory cells.

Following the etching process, a first conductive film 622 is formed over the resulting structure to bury the first contact holes while providing a planarized upper surface. The first conductive film 622 is made of a multilayered Ti/TiN/W film, an Al alloy film, an Si/metal compound film, or other metal film. A photoresist film pattern 624 is then formed on the first conductive film 622 in accordance with a photolithography process using the source electrode line mask 310 of FIG. 4c.

Figure 6D:
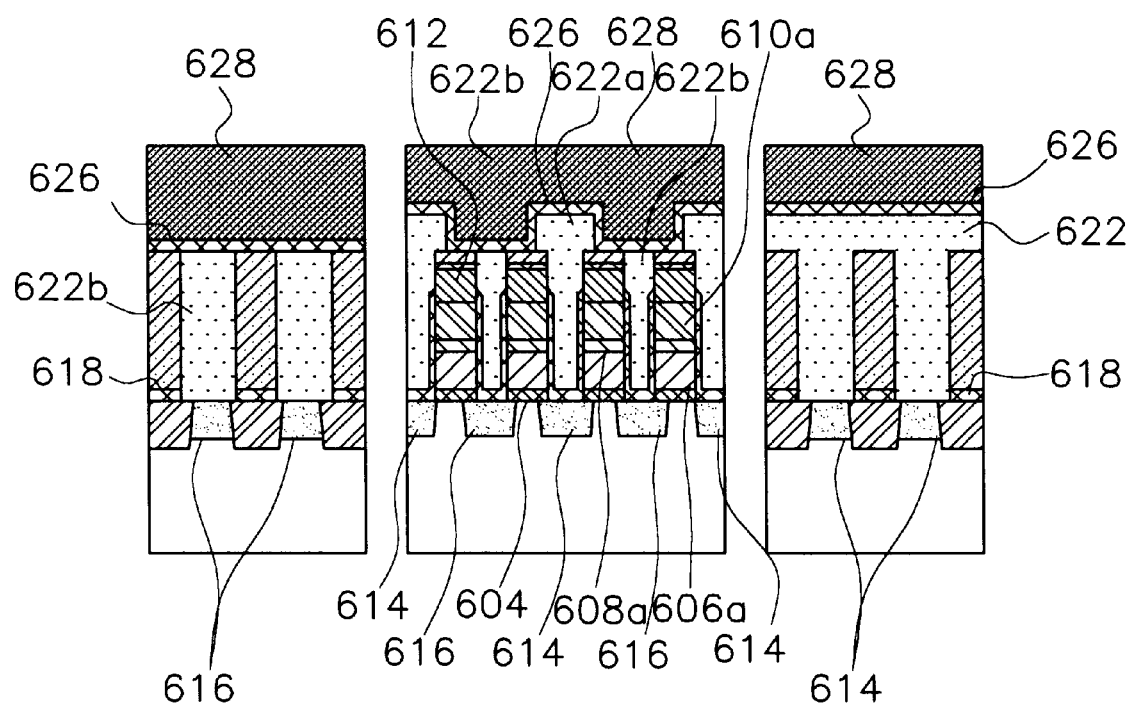

Referring to FIG. 6d, the first conductive film 622 is then etched using the photoresist film pattern 624. After the etching of the first conductive film 622, the photoresist film pattern 624 is completely stripped. As a result, source electrode lines 622a and contact plugs 622b are formed, which contact the source and,, drain electrodes 614 and 616, respectively. At this time, the upper surface of the remaining interlayer insulating film 620 is partially exposed. A second etching barrier film 626 is then formed on the exposed first interlayer insulating film 620, source electrode lines 622a, and contact plugs 622b. Subsequently, a second insulating film 628, which is made of an oxide film or a nitride film, is formed over the second etching barrier film 626 in such a fashion that it provides a planarized upper surface. Here, the formation of the second etching barrier film 626 may be omitted.

Figure 6E:
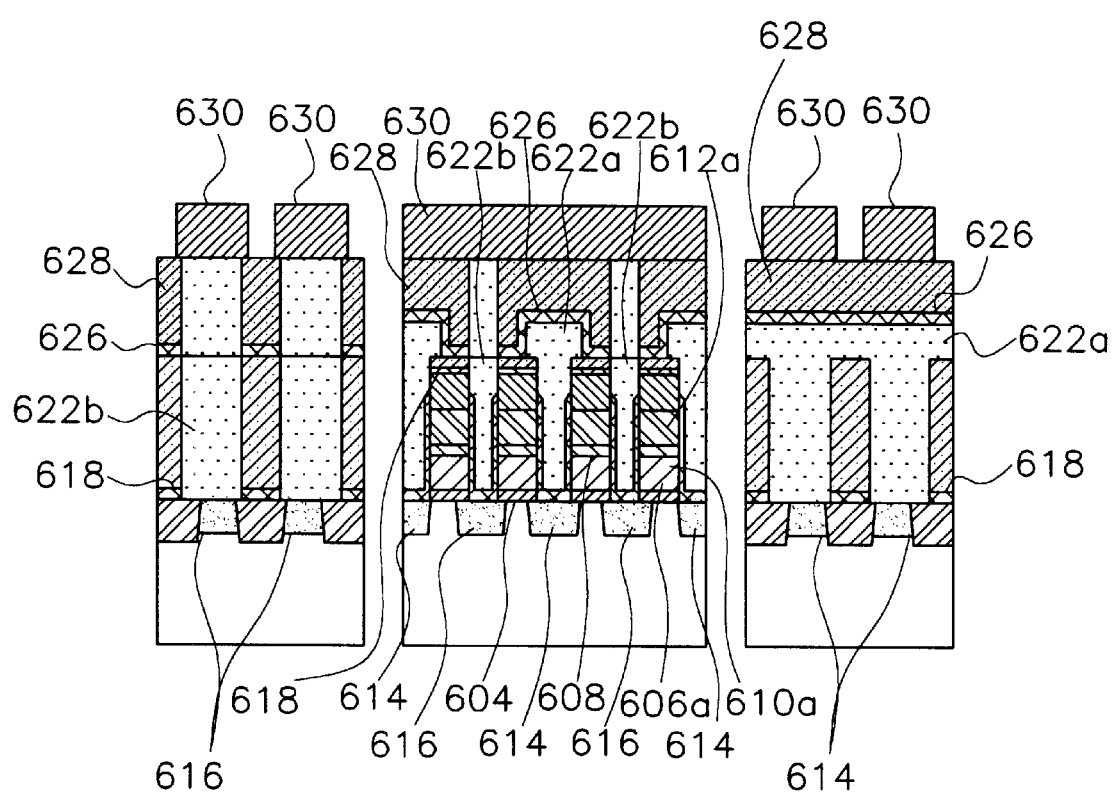

Referring to FIG. 6e, the portions of the second interlayer insulating film 628 respectively arranged over the contact plugs 622b are then etched using the second etching barrier film 626 and the contact mask 308 of FIG. 3. Following this etching process, the portions of the second etching barrier film 626 exposed due to the etching of the second etching barrier film 626 are stripped. As a result, second contact holes are defined, through which the contact plugs 622b are exposed. Thereafter, a second conductive film is formed over the resulting structure to bury the second contact holes while providing a planarized upper surface. The second conductive film is made of a multilayered Ti/TiN/W film, an Al alloy film, an Si/metal compound film, or other metal film. This second conductive film is then patterned to form bit lines 630 contacting the contact plugs 622b. Thus, NOR type memory cells are obtained.

In accordance with this embodiment, respective source electrodes of unit memory cells are separated from one another. Respective groups of these source electrodes are connected to source electrode lines additionally formed, respectively. Accordingly, it is unnecessary to provide an overlap between the isolation mask and the control gate electrode mask. As a result, it is possible to reduce the unit cell area of NOR type memory cells. This makes it possible to achieve a high integration of NOR type memory cells.

A method for fabricating NOR memory cells in accordance with another embodiment of the present invention will now be described with reference to FIGS. 7a to 7c. This embodiment has the same structure as that of the above mentioned embodiment, except that there is no step defined between the source electrode lines and the contact plugs. Accordingly, the description of this embodiment will be described, stating from the formation of the second interlayer insulating film.

Figure 7A:
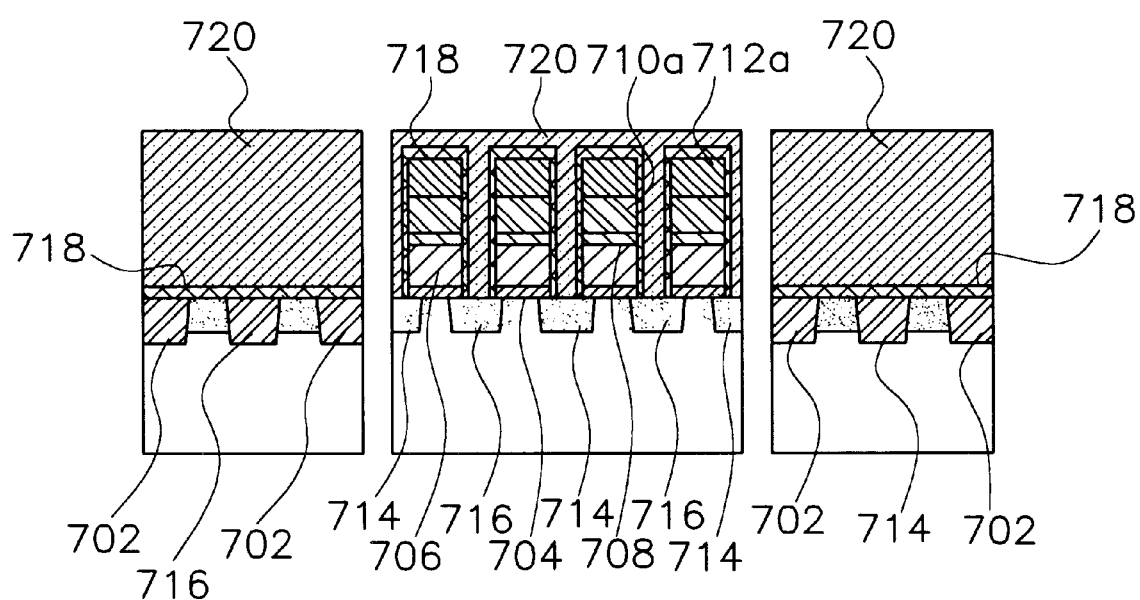
FIGS. 7a to 7c are cross-sectional views respectively illustrating a method for fabricating NOR memory cells in accordance with another embodiment of the present invention, in which each figure includes cross-sectional views respectively taken along the lines X1–X1', Y–Y', and X2–X2' of FIG. 3.

Referring to FIG. 7a, a first interlayer insulating film 720 is formed over a first etching barrier film 718, corresponding to the first etching barrier film 618 shown in FIG. 6b, in such a fashion that it provides a planarized upper surface. Preferably, the first interlayer insulating film 720 is made of an oxide film and has a thickness more than that of at least source electrode lines to be subsequently formed.

Figure 7B:
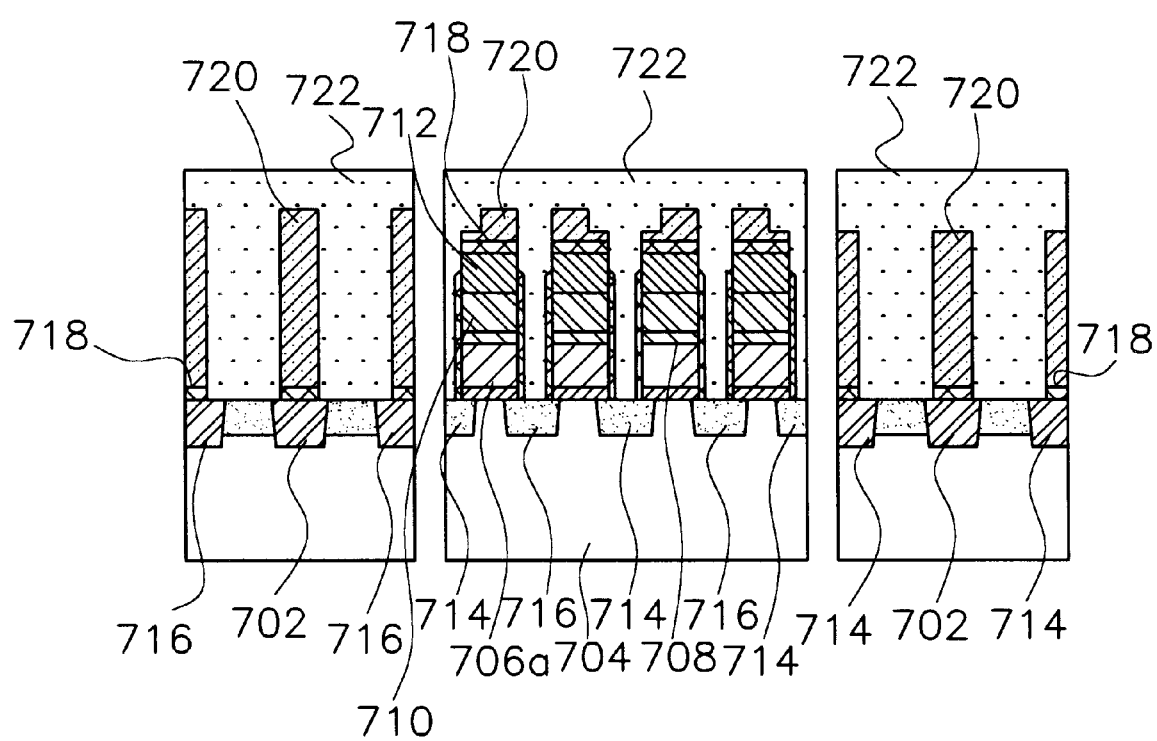
Figure 7C:
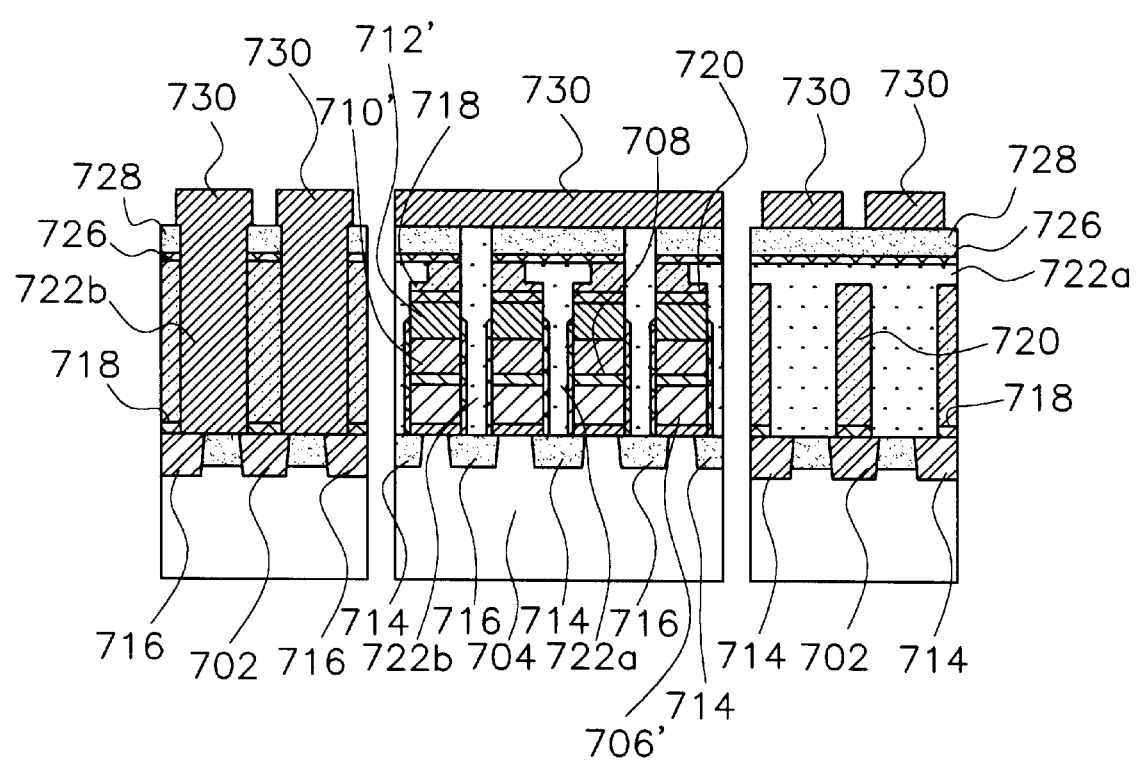

In FIG. 7a to 7c, respective elements not denoted by any reference numeral correspond to those shown at corresponding positions of FIG. 6b. Therefore, no description will be made for those elements.

Referring to FIG. 7b, the first interlayer insulating film 720 is patterned to form grooves having the same shape as that of source electrode lines to be subsequently formed. Thereafter, the portions of the first interlayer insulating film 720 respectively disposed on source and drain electrodes 714 and 716 are etched using a first etching barrier film 718 and the contact mask 308 of FIG. 3. Thereafter, the portions of the first etching barrier film 718 exposed due to the partial removal of the first interlayer insulating film 720 are then etched. As a result, first contact holes are defined, through which the source and drain electrodes 714 and 716 are exposed. In this embodiment, a source electrode line mask having a type opposite to that of the mask shown in FIG. 6c is used. Where a source electrode line mask having the same type as that of the mask of FIG. 6c is used in this embodiment, it is desirable to use a photoresist film of an opposite type. Although the first contact holes has been described as being formed after the formation of the grooves, they may be formed prior to the formation of the grooves. Subsequently, a first conductive film 722 is formed over the resulting structure to bury the first contact holes. The first conductive film 722 is made of a multilayered Ti/TiN/W film, an Al alloy film, a Si/metal compound film, or other metal film.

Referring to FIG. 7c, the first conductive film 722 is then etched in accordance with an etch-back process using a chemical mechanical polishing (CMP) or etching gas until the first interlayer insulating film 720 is exposed. As a result, source electrode lines 722a and contact plugs 722b are formed, which contact the source and drain electrodes 714 and 716, respectively. In this case, the source electrode lines 722a and contact plugs 722b are flush with each other so that there is no step defined therebetween. A second etching barrier film 726 is subsequently formed on the first interlayer insulating film 720, source electrode lines 722a, and contact plugs 722b which are flush with one another. A second interlayer insulating film 728 is formed over the second etching barrier film 726 in such a fashion that it provides a planarized upper surface. Thereafter, respective portions of the second interlayer insulating film 728 and second etching barrier film 726 disposed on the contact plugs 722b are etched, thereby forming second contact holes. Through the second contact holes, bit lines 730 come into contact with the contact plugs 722b.

Similar to the above mentioned embodiment, the etching of the first interlayer insulating film 720 is carried out in a self-aligned fashion, using the contact mask 308 and the first etching barrier film 718. Accordingly, Accordingly, the space between neighboring gate electrodes is minimized. That is, it is possible to achieve a high integration of NOR memory cells.

A method for fabricating NOR memory cells in accordance with another embodiment of the present invention will now be described with reference to FIGS. 8a and 8b. This embodiment has the same structure as those of the above mentioned embodiments, except that contacts connected to drain electrodes have a hole shape, and contacts connected to source electrodes have a trough shape.

Figure 8A:
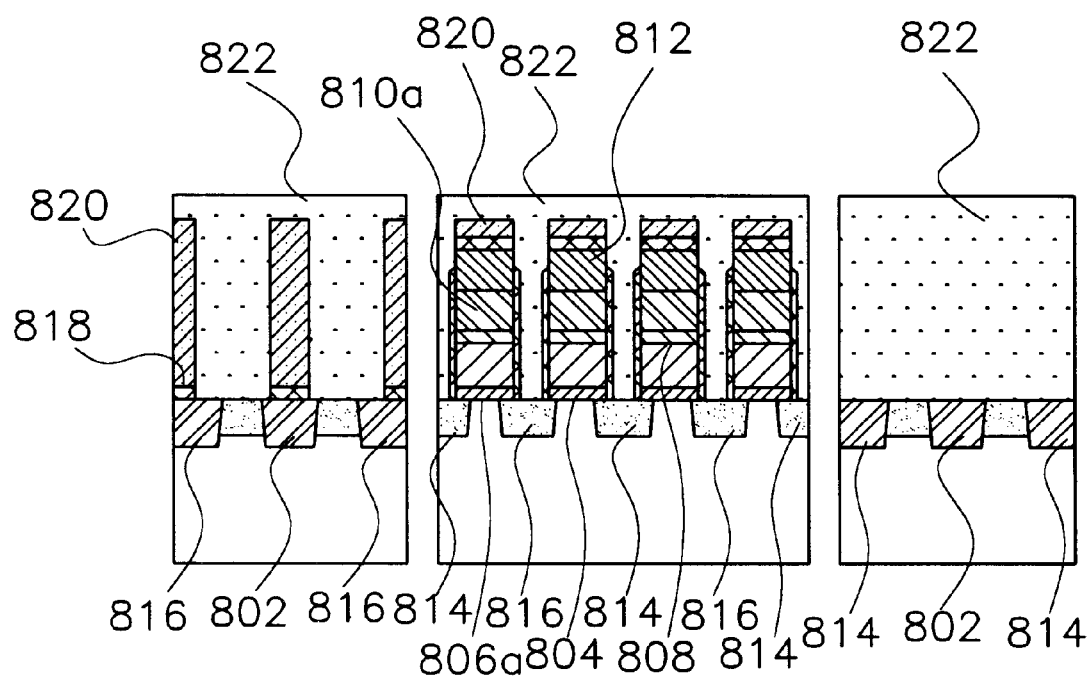
FIGS. 8a and 8b are cross-sectional views respectively illustrating a method for fabricating NOR memory cells in accordance with another embodiment of the present invention, in which each figure includes cross-sectional views respectively taken along the lines X1–X1', Y–Y', and X2–X2' of FIG. 3.

Referring to FIG. 8a, a first interlayer insulating film 820 is formed over a first etching barrier film 818, corresponding to the first etching barrier film 618 of FIG. 6b, in such a fashion that it provides a planarized upper surface. The first etching barrier film 818 is made of a nitride film. Thereafter, respective portions of the first interlayer insulating film 820 and first etching barrier film 618 disposed on the source and drain electrodes 814 and 816 are etched, thereby forming first contact holes through which the source and drain electrodes 814 and 816 are exposed, respectively. Preferably, the first interlayer insulating film 720 is made of an oxide film and has a thickness more than that of at least source electrode lines to be subsequently formed. Those of the first contact holes exposing the drain electrodes 816 have a hole shape whereas those of the first contact holes exposing the source electrodes 814 have a trough shape. Subsequently, a first conductive film 822 is formed over the resulting structure to bury the first contact holes. The first conductive film 822 is made of a multilayered Ti/TiN/W film, an Al alloy film, a Si/metal compound film, or other metal film.

Figure 8B:
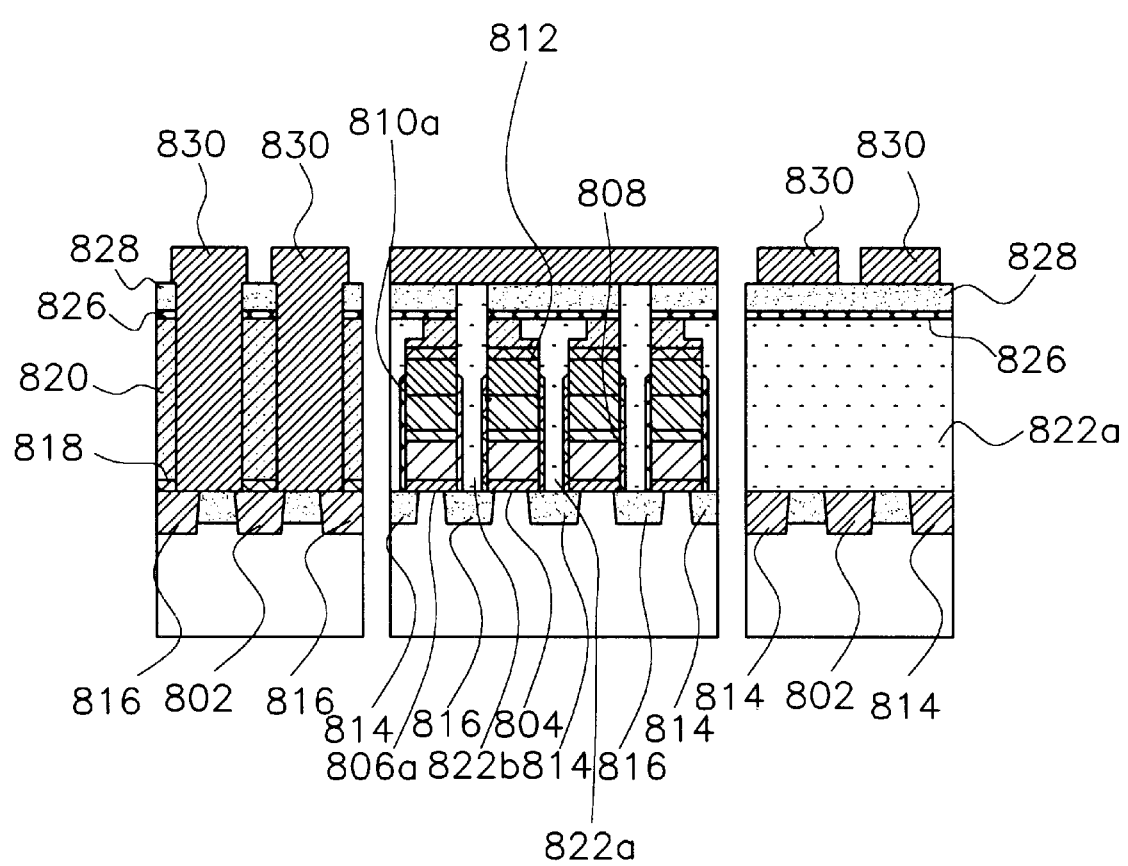

In FIGS. 8a and 8b, respective elements not denoted by any reference numeral correspond to those shown at corresponding positions of FIG. 6b. Therefore, no description will be made for those elements.

Referring to FIG. 8b, the first conductive film 822 is then etched in accordance with an etch-back process using a CMP or etching gas until the first interlayer insulating film 820 is exposed. As a result, source electrode lines 822a and contact plugs 822b are formed, which contact the source and drain electrodes 814 and 816, respectively. In this case, the source electrode lines 822a and contact plugs 822b are flush with each other so that there is no step defined therebetween. A second etching barrier film 826 is subsequently formed on the first interlayer insulating film 820, source electrode lines 822a, and contact plugs 822b which are flush with one another. A second interlayer insulating film 828 is formed over the second etching barrier film 826 in such a fashion that it provides a planarized upper surface. Thereafter, respective portions of the second interlayer insulating film 828 and second etching barrier film 826 disposed on the contact plugs 822b are etched, thereby forming second contact holes. Through the second contact holes, bit lines 830 come into contact with the contact plugs 822b.

Similar to the above mentioned embodiments, the etching of the first interlayer insulating film 820 is carried out in a self-aligned fashion, using the contact mask 308 and the first etching barrier film 818. Accordingly, the space between neighboring gate electrodes is minimized. That is, it is possible to achieve a high integration of NOR memory cells.

As apparent from the above description, in accordance with the present invention, source electrode lines are formed by separate metal lines, in place of impurity diffusion regions as in conventional cases. Accordingly, the isolation mask and control gate electrode mask used in the manufacture of NOR type memory cells do not overlap with each other. Accordingly, it is possible to achieve a reduction in cell area by an area corresponding to the overlapping are involved in conventional cases. Thus, it is possible to achieve a high integration of NOR memory cells.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating NOR type memory cells of a non-volatile memory device, comprising the steps of:

forming a floating gate insulating film, a floating gate electrode, a control gate insulating film, a control gate electrode, and an insulating film sequentially on each of memory cell regions of a semiconductor substrate defined by an isolation film;

forming a source electrode and a drain electrode in portions of the semiconductor substrate exposed at both sides of the gate electrode, respectively;

forming a first etching barrier film on a resulting structure;

forming a first interlayer insulating film on the first etching barrier film in a planarized fashion;

etching a desired portion of the first interlayer insulating film so as to form a first contact hole exposing the source and drain electrodes, respectively;

removing portions of the first etching barrier film exposed due to the step of etching the desired portion of the first interlayer insulating film;

forming a first conductive film in a planarized fashion on a resulting structure so as to bury the first contact hole;

etching the first conductive film so as to form a source electrode line contacting the source electrode and a contact plug contacting the drain electrode;

forming a second etching barrier film on a resulting structure;

forming a second interlayer insulating film in a planarized fashion on the second etching barrier film;

etching a desired portion of the second insulating film so as to form a second contact hole exposing the contact plug; and forming a bit line connected to the contact plug via the second contact hole on the second interlayer insulating film.

2. The method according to claim 1, wherein the step of forming the control gate electrode and the floating gate electrode comprises the steps of:

forming a floating gate insulating film and a first conductive film for a floating gate electrode on the semiconductor substrate defined by the isolation film, in turn;

etching the first conductive film so as to expose a portion of a floating gate insulating film disposed over the isolation film;

forming a control gate insulating film, a second conductive film for a control gate electrode, and a planarized insulating film on a resulting structure, in turn; and etching the planarized insulating film, the second conductive film, the control gate insulating film, the first conductive film, and the floating gate insulating film.

3. The method according to claim 1, wherein the step of forming the control gate insulating film comprises the steps of:

depositing a nitride film; and oxidizing the nitride film.

4. The method according to claim 1, wherein the first interlayer insulating film has a thickness more than that of the source electrode line.

5. The method according to claim 1, wherein the second contact hole is formed to expose the source and drain electrodes, respectively.

6. A method for fabricating NOR type memory cells of a non-volatile memory device, comprising the steps of:

forming a floating gate insulating film, a floating gate electrode, a control gate insulating film, a control gate electrode, and an insulating film sequentially on each of memory cell regions of a semiconductor substrate defined by an isolation film;

forming a source electrode and a drain electrode in portions of the semiconductor substrate exposed at both sides of the gate electrode, respectively;

forming a first etching barrier film on a resulting structure;

forming a first interlayer insulating film on the first etching barrier film in a planarized fashion;

forming a groove at a portion of the first interlayer insulating film corresponding to a region where a source electrode line is to be formed;

etching the first interlayer insulating film so as to form a first contact hole exposing the source and drain electrodes;

removing portions of the first etching barrier film exposed due to the step of etching the desired portion of the first interlayer insulating film;

forming the first conductive film in a planarized fashion on the resulting structure so as to bury the first contact hole;

etching back the first conductive film until the first interlayer insulating film is exposed so as to form the source electrode line and a contact plug;

forming a second barrier film on a resulting structure;

forming a second interlayer insulating film on the second barrier film;

etching the second interlayer film and the second etching barrier film so as to form a second contact hole exposing the contact plug; and forming a bit line connected to the contact plug via the second contact hole on the second interlayer insulating film.

* * * * *